United States Patent
Yamazaki et al.

(10) Patent No.: US 8,518,761 B2
(45) Date of Patent: Aug. 27, 2013

(54) DEPOSITION METHOD AND METHOD FOR MANUFACTURING SEMICONDUCTOR DEVICE

(75) Inventors: Shunpei Yamazaki, Tokyo (JP); Junichiro Sakata, Kanagawa (JP); Makoto Furuno, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 49 days.

(21) Appl. No.: 13/085,518

(22) Filed: Apr. 13, 2011

(65) Prior Publication Data

US 2011/0256673 A1    Oct. 20, 2011

(30) Foreign Application Priority Data

Apr. 16, 2010  (JP) ................. 2010-095333

(51) Int. Cl.
*H01L 21/00* (2006.01)

(52) U.S. Cl.
USPC .......... 438/151; 438/586; 257/E21.409

(58) Field of Classification Search
USPC .......... 438/159, 161, 608; 257/E21.37, 257/E21.378, E21.4, E21.457
See application file for complete search history.

(56) References Cited

U.S. PATENT DOCUMENTS

| | | |
|---|---|---|
| 5,451,548 A | 9/1995 | Hunt et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |

(Continued)

FOREIGN PATENT DOCUMENTS

| | | |
|---|---|---|
| CN | 101375405 A | 2/2009 |
| CN | 101506986 A | 8/2009 |

(Continued)

OTHER PUBLICATIONS

Invitation to Pay Additional Fees, PCT Application No. PCT/JP2011/059473, dated May 17, 2011, 3 pages.

(Continued)

*Primary Examiner* — Cheung Lee
(74) *Attorney, Agent, or Firm* — Fish & Richardson P.C.

(57) ABSTRACT

An object is to provide a deposition method in which a gallium oxide film is formed by a DC sputtering method. Another object is to provide a method for manufacturing a semiconductor device using a gallium oxide film as an insulating layer such as a gate insulating layer of a transistor. An insulating film is formed by a DC sputtering method or a pulsed DC sputtering method, using an oxide target including gallium oxide (also referred to as $GaO_X$). The oxide target includes $GaO_X$, and X is less than 1.5, preferably more than or equal to 0.01 and less than or equal to 0.5, further preferably more than or equal to 0.1 and less than or equal to 0.2. The oxide target has conductivity, and sputtering is performed in an oxygen gas atmosphere or a mixed atmosphere of an oxygen gas and a rare gas such as argon.

22 Claims, 6 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,906,780 B2 | 3/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0220023 A1* | 10/2006 | Hoffman et al. ............ 257/72 |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0174012 A1 | 7/2009 | Iwasaki |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2009/0325341 A1 | 12/2009 | Itagaki et al. |
| 2010/0038641 A1 | 2/2010 | Imai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0295041 A1 | 11/2010 | Kumomi et al. |
| 2011/0175081 A1* | 7/2011 | Goyal et al. ............ 257/43 |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |

FOREIGN PATENT DOCUMENTS

| | | |
|---|---|---|
| CN | 101621076 A | 1/2010 |
| EP | 0674344 A2 | 9/1995 |
| EP | 1 737 044 A1 | 12/2006 |
| EP | 2 141 743 A1 | 1/2010 |
| EP | 2 141 744 A1 | 1/2010 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07268609 A | 10/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007109918 A | 4/2007 |
| JP | 2007-123861 A | 5/2007 |
| JP | 2007-201366 A | 8/2007 |
| JP | 2007-223849 A | 9/2007 |
| JP | 2008-053356 A | 3/2008 |
| JP | 2009-228068 A | 10/2009 |
| JP | 2010-016347 A | 1/2010 |
| JP | 2010-016348 A | 1/2010 |
| JP | 2010-067954 A | 3/2010 |
| KR | 2009057257 A | 6/2009 |
| KR | 10-2010-0002503 A | 1/2010 |
| WO | 2004/114391 A1 | 12/2004 |
| WO | 2007/086291 A1 | 8/2007 |
| WO | 2008/023553 A1 | 2/2008 |

OTHER PUBLICATIONS

International Search Report (Application No. PCT/JP2011/059473) Dated Jul. 12, 2011.

Written Opinion (Application No. PCT/JP2011/059473) Dated Jul. 12, 2011.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review, A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al.. "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thing-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Osa, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Masuda, S et al., "Transparent thin film transistors using ZnO as an active channel layer and their electrical properties," J. Appl, Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors." Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09:Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

DEPOSITION METHOD AND METHOD FOR MANUFACTURING SEMICONDUCTOR DEVICE

TECHNICAL FIELD

The present invention relates to a deposition method using an oxide target. Further, the present invention relates to a semiconductor device including a circuit which is formed using a transistor obtained by using an oxide target, and a method for manufacturing the semiconductor device. For example, the present invention relates to an electronic device on which an electro-optical device typified by a liquid crystal display panel or a light-emitting display device including an organic light-emitting element is mounted as a component.

In this specification, a semiconductor device generally means a device which can function by utilizing semiconductor characteristics, and an electro-optical device, a semiconductor circuit, and an electronic device are all semiconductor devices.

BACKGROUND ART

As a method for forming a material film of a transistor, there is a sputtering method, which is a deposition method used when a material having low vapor pressure is deposited or when film thickness needs to be controlled precisely. A sputtering method uses a deposition apparatus which can be operated very easily, and thus is industrially used widely.

A sputtering method is a deposition method using a sputtering target, and a sintered body, or a single crystal in some cases, of metal, metal oxide, metal nitride, metal carbide, or the like is used as the sputtering target.

In a sputtering method, after the pressure in a deposition chamber of a deposition apparatus is reduced by a vacuum apparatus, a rare gas such as argon is introduced into the deposition chamber, and glow discharge is caused between a deposition substrate and a sputtering target to generate plasma, using the deposition substrate as an anode and the sputtering target as a cathode. Thus, positive ions in the plasma are made to collide with the sputtering target, and particles which are components of the sputtering target are sputtered to be deposited over the deposition substrate, so that a material film is formed.

A sputtering method is classified depending on a method used for generating plasma, and a method using high-frequency plasma is referred to as a high-frequency sputtering method (also referred to as an RF sputtering method), and a method using direct-current plasma is referred to as a direct-current sputtering method (also referred to as a DC sputtering method).

Since a less expensive power supply facility is used and deposition rate is higher in the DC sputtering method than in the high-frequency sputtering method, the DC sputtering method is more industrially used than the high-frequency sputtering method, in consideration of productivity and manufacturing cost.

In general, a film of a metal material used for a wiring or the like is often formed by the DC sputtering method, and an insulating film is often formed by a PCVD method or the high-frequency sputtering method. In the high-frequency sputtering method, deposition can be performed even when a sputtering target having an insulating property is used.

Further, a technique in which a transistor including an oxide semiconductor is manufactured and applied to an electronic device or an optical device has attracted attention. For example, a technique of manufacturing a transistor by using zinc oxide or In—Ga—Zn—O-based oxide as an oxide semiconductor, and using the transistor for a switching element of a pixel of a display device and the like is disclosed in Patent Document 1 and Patent Document 2.

REFERENCE

Patent Document

[Patent Document 1] Japanese Published Patent Application No. 2007-123861
[Patent Document 2] Japanese Published Patent Application No. 2007-096055

DISCLOSURE OF INVENTION

An object is to provide a deposition method in which a gallium oxide film is formed by a DC sputtering method.

Another object is to provide a method for manufacturing a semiconductor device using a gallium oxide film as an insulating layer such as a gate insulating layer of a transistor.

In addition, another object is to manufacture a semiconductor device which includes an oxide semiconductor layer, has stable electric characteristics, and is highly reliable.

According to one embodiment of the present invention disclosed in this specification, an insulating film is formed by a DC sputtering method or a pulsed DC sputtering method using an oxide target including gallium oxide (also referred to as $GaO_X$). Note that the pulsed DC sputtering method is one kind of a DC sputtering method, in which a pulsed DC power source is used to apply a bias in a pulsed manner. In the DC sputtering method, the temperature of a sputtering target tends to become high; thus, in the case where the melting point of the oxide target is low, it is preferable to use the pulsed DC sputtering method which uses a pulsed DC power source. Further, when a pulsed DC power source is used, high-density plasma can be generated. The oxide target includes $GaO_X$, and X is less than 1.5, preferably more than or equal to 0.01 and less than or equal to 0.5, further preferably more than or equal to 0.1 and less than or equal to 0.2. This oxide target has conductivity, and when sputtering is performed in an oxygen gas atmosphere or a mixed atmosphere of an oxygen gas and a rare gas such as argon, a gallium oxide film containing much oxygen that exceeds the stoichiometric proportion can be formed.

In this specification, "exceeding the stoichiometric proportion" means that X of an insulating film denoted by $GaO_X$ exceeds 1.5, for example, is three, in comparison with the ratio of oxygen in $Ga_2O_3$ which has a single crystal structure.

Note that the deposition temperature of the gallium oxide film formed by a DC sputtering method or a pulsed DC sputtering method is higher than or equal to room temperature and lower than or equal to 400° C.

The oxide target having conductivity may contain silicon or aluminum, in other words, $SiO_X$ (X>0) or $AlO_X$ (X>0). In that case, the concentration of Si or Al in the oxide target including gallium oxide is higher than or equal to 0.01 atom % and lower than or equal to 10 atom %.

With the above structure, at least one of the above objects can be achieved.

One embodiment of the present invention disclosed in this specification is a method for manufacturing a semiconductor device including the steps of forming a gate electrode, forming a gate insulating layer including a gallium oxide film by a sputtering method, forming an oxide semiconductor layer overlapping with the gate electrode over the gate insulating layer, and stacking a gallium oxide film in contact with the oxide semiconductor layer by a sputtering method.

One embodiment of the present invention disclosed in this specification is a method for manufacturing a semiconductor device including the steps of forming an oxide semiconductor layer by a sputtering method, forming a gate insulating layer including a gallium oxide film on and in contact with the oxide semiconductor layer by a sputtering method, and forming a gate electrode over the gate insulating layer.

In each of the above structures, the oxide semiconductor layer functioning as a semiconductor layer of a transistor is preferably formed using a metal oxide material containing much oxygen that exceeds the stoichiometric proportion.

As a material for the insulating layer which is in contact with the oxide semiconductor layer functioning as a semiconductor layer of a transistor, a gallium oxide film obtained by a DC sputtering method or a pulsed DC sputtering method is preferably used.

In the case where an integrated circuit into which a transistor is incorporated is mounted on an electronic device, for example, a driving voltage of 5 V to 10 V is used in a pixel portion of a liquid crystal panel, depending on the mode of liquid crystals. Thus, the transistor provided in the pixel portion preferably has a structure suitable for operation at a driving voltage of 5 V to 10 V. Accordingly, when an insulating layer formed using a gallium oxide film is used as a gate insulating layer in a liquid crystal panel, the thickness of the insulating layer is greater than or equal to 50 nm and less than or equal to 500 nm, preferably greater than or equal to 60 nm and less than or equal to 300 nm.

When a transistor is mounted on an LSI, without being limited to applications to a liquid crystal display device, the thickness of a gate insulating layer formed using a gallium oxide film is greater than or equal to 3 nm and less than or equal to 50 nm, preferably greater than or equal to 5 nm and less than or equal to 20 nm, so that operation is performed at high speed. In the case of a transistor having a high withstand voltage such as a power device, a gate insulating layer formed using a gallium oxide film having a thickness of greater than or equal to 50 nm and less than or equal to 500 nm, preferably greater than or equal to 100 nm and less than or equal to 300 nm is used.

Further, the oxide semiconductor layer functioning as a semiconductor layer of a transistor may be sandwiched between insulating layers each formed using a gallium oxide film For example, there are a structure in which the oxide semiconductor layer functioning as a semiconductor layer of a transistor is sandwiched between a base insulating layer formed using a gallium oxide film and a gate insulating layer formed using a gallium oxide film, and a structure in which the oxide semiconductor layer functioning as a semiconductor layer of a transistor is sandwiched between a gate insulating layer formed using a gallium oxide film and a protective insulating layer formed using a gallium oxide film.

When a gallium oxide film formed by a DC sputtering method or a pulsed DC sputtering method is used as a material for an insulating layer which is in contact with an oxide semiconductor layer functioning as a semiconductor layer of a transistor, the transistor can have stable electric characteristics and thus a highly reliable semiconductor device can be manufactured.

A deposition method in which a high-purity gallium oxide film is formed by a DC sputtering method can be provided.

When a gallium oxide film formed by a DC sputtering method or a pulsed DC sputtering method is provided in contact with an oxide semiconductor layer, a transistor can have stable electric characteristics and thus a highly reliable semiconductor device can be manufactured.

BEST MODE FOR CARRYING OUT THE INVENTION

Figure 1A:
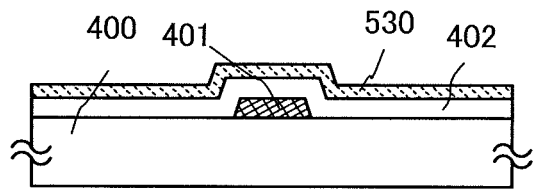
FIGS. 1A to 1E are cross-sectional views illustrating one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, a deposition method of a gallium oxide film over a substrate to be processed will be described.

A deposition apparatus using a sputtering method includes a deposition chamber in which pressure can be reduced by a vacuum evacuation unit such as a vacuum pump, a transfer robot for transferring a substrate to be processed into the deposition chamber, a substrate holder for fixing the substrate to be processed, a target holder for holding a sputtering target, an electrode corresponding to the sputtering target held by the target holder, a power supply unit for applying DC voltage for sputtering to the electrode, and a gas supply unit for supplying gas into the deposition chamber.

In general, a sputtering target has a structure in which a sputtering target material is bonded to a metal plate called a backing plate. A backing plate has functions of cooling a sputtering target material and being a sputtering electrode and thus is often formed using copper, which is excellent in thermal conductivity and electric conductivity. A cooling path is formed inside or on the back surface of the backing plate, and water, oil, or the like circulates through the cooling path as a coolant; thus, the cooling efficiency of the sputtering target material can be increased. Note that water vaporizes at 100° C.; therefore, in the case where the temperature of the sputtering target material needs to be kept at 100° C. or higher, oil or the like is preferable to water.

A sputtering target material for the gallium oxide film includes, for example, $GaO_X$. $GaO_X$ in which X is less than 1.5, preferably more than or equal to 0.01 and less than or equal to 0.5, is sintered at high temperature to faun the sputtering target material. The sputtering target material including $GaO_X$ in which X is more than or equal to 0.01 and less than or equal to 0.5 has sufficient conductivity and can be used for sputtering using a DC power source or a pulsed DC power source. Si or Al may be contained in the sputtering target material for the gallium oxide film, and the concentration thereof is higher than or equal to 0.01 atom % and lower than or equal to 10 atom %. The sintering is performed in an inert gas atmosphere (a nitrogen atmosphere or a rare gas atmosphere), whereby hydrogen, moisture, hydrocarbon, or the like can be prevented from being mixed into the sputtering target material. The sintering may be performed in vacuum or in a high-pressure atmosphere, and further, may be performed with application of mechanical pressure.

It is preferable that the sputtering target material and the backing plate be bonded to each other, for example, by electron beam welding. The electron beam welding refers to a method in which electrons generated in a vacuum atmosphere are accelerated, focused, and then delivered to an object, whereby welding can be performed only on a portion which is desired to be welded without damage on the material property of portions of the object except for the welded portion. In the electron beam welding, the shape of the welded portion and the depth of welding can be controlled. Since the welding is performed in a vacuum atmosphere, hydrogen, moisture, hydrocarbon, or the like can be prevented from attaching to the sputtering target material.

Similarly, the sputtering target is set in the deposition apparatus in an inert gas atmosphere (a nitrogen atmosphere or a rare gas atmosphere) without being exposed to the air, so that hydrogen, moisture, hydrocarbon, or the like can be prevented from attaching to the sputtering target material.

After the sputtering target is set in the deposition apparatus, dehydrogenation treatment is preferably performed to remove hydrogen which remains on a surface of or inside the sputtering target material. As the dehydrogenation treatment, a method in which the inside of the deposition chamber is heated to a high temperature of 200° C. or higher under reduced pressure, a method in which introduction and exhaust of nitrogen or an inert gas are repeated while the inside of the deposition chamber is heated, and the like can be given. In this case, not water but oil or the like is preferably used as a coolant for the sputtering target material. Although a certain level of effect can be obtained when introduction and exhaust of nitrogen are repeated without heating, it is more preferable to perform the treatment with the inside of the deposition chamber heated.

Note that as the vacuum pump used in the deposition apparatus, which is for removing the moisture remaining in the deposition chamber, for example, a cryopump, an ion pump, or a titanium sublimation pump is preferably used. An evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are evacuated, whereby the concentration of impurities in the oxide semiconductor layer formed in the deposition chamber can be reduced. Note that the cryopump is a pump by which exhaust is performed in such a manner that a surface having extremely low temperature is provided in a vacuum chamber, and gas molecules in the vacuum chamber are condensed on or adsorbed to the surface having extremely low temperature so as to be captured. The cryopump has high capability of exhausting hydrogen or moisture.

As a gas used in sputtering, a high-purity gas in which the concentration of hydrogen, moisture, hydrocarbon, or the like is reduced as much as possible is preferably used. The gas supply unit for supplying gas into the deposition chamber is a gas supply source including a gas pipe, and when a refiner is provided between the gas supply source and the deposition chamber, the purity of the gas can be further improved. A gas whose purity is 99.9999% or higher is preferably used. Further, in order to prevent gas from being mixed in through an inner wall of the gas pipe, a gas pipe whose inner surface has been subjected to mirror polishing and passivation with $Cr_2O_3$ or $Al_2O_3$ is preferably used. As a joint or a valve of the pipe, an all-metal valve in which a resin is not used in its sealing portion is preferable.

Sputtering is performed using the above sputtering target, under the following conditions: the atmosphere is an oxygen gas atmosphere or a mixed atmosphere of a rare gas and an oxygen gas, the deposition pressure is greater than or equal to 0.1 Pa and less than or equal to 1 Pa, the deposition temperature is higher than or equal to room temperature and lower than or equal to 300° C., and a DC power source (the DC power is greater than or equal to 100 W and less than or equal to 300 W) is used. In the sputtering, the proportion of rare gas introduced, the proportion of oxygen gas introduced, the power supplied, and the like are optimized, whereby an insulating layer formed using a high-quality gallium oxide film can be obtained. A DC sputtering method is suitable for industrial application because deposition is not greatly affected by heat and can be performed at high speed.

The gallium oxide film ($GaO_X$ film) obtained in the above manner can be used in a semiconductor device as an insulating layer. For example, the gallium oxide film can be used for a gate insulating layer, a protective insulating layer, a base insulating layer, or the like of a transistor.

Embodiment 2

An example of a manufacturing process of a transistor 410 in which a gallium oxide film obtained by the deposition method described in Embodiment 1 is used as an insulating layer will be described with reference to FIGS. 1A to 1E.

First, a gate electrode 401 is formed over a substrate 400.

Although there is no particular limitation on a material and the like of the substrate 400, it is necessary that the substrate have heat resistance high enough to withstand at least heat treatment performed later. For example, a glass substrate, a ceramic substrate, a quartz substrate, a sapphire substrate, or the like can be used as the substrate 400. Alternatively, a single crystal semiconductor substrate or a polycrystalline semiconductor substrate of silicon, silicon carbide, or the like; a compound semiconductor substrate of silicon germanium or the like; an SOI substrate; or the like can be used. Further, a structure in which a semiconductor element is provided over any of these substrates may be employed as the substrate 400.

Alternatively, a flexible substrate may be used as the substrate 400. In the case where a transistor is provided over a flexible substrate, the transistor can be directly formed over the flexible substrate, or the transistor may be formed over a separate substrate and then separated therefrom to be transferred to the flexible substrate. Note that in order to separate the transistor and transfer it to the flexible substrate, it is preferable to form a separation layer between the above separate substrate and the transistor.

Then, a gate insulating layer 402 is formed to cover the gate electrode 401.

The gate insulating layer 402 is formed by the DC sputtering method described in Embodiment 1, using an oxide target including gallium oxide. The gate insulating layer 402 is preferably formed by a method in which hydrogen, water, or the like does not easily enter the gate insulating layer 402. The thickness of the gate insulating layer 402 is greater than or equal to 50 nm and less than or equal to 500 nm, preferably greater than or equal to 60 nm and less than or equal to 300 nm.

Then, an oxide semiconductor film 530 is formed on and in contact with the gate insulating layer 402 (see FIG. 1A). As a material used for the oxide semiconductor film 530, the following metal oxide can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; or the like. The above oxide semiconductors may include an element other than In, Ga, Sn, and Zn, for example, $SiO_2$.

For example, an In—Ga—Zn—O-based oxide semiconductor means an oxide semiconductor including indium (In), gallium (Ga), and zinc (Zn), and there is no limitation on the composition ratio thereof.

In addition, for the oxide semiconductor film 530, a thin film of a material represented by the chemical formula, $InMO_3(ZnO)_m$ (m>0), can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 2:1 in a molar ratio), further preferably In:Zn=15:1 to 1.5:1 in an atomic ratio ($In_2O_3$:ZnO=15:2 to 3:4 in a molar ratio). For example, when a target used for forming the In—Zn—O-based oxide semiconductor has a composition ratio of In:Zn:O=X:Y:Z in an atomic ratio, Z>(1.5X+Y).

In this embodiment, the oxide semiconductor film 530 is formed by a sputtering method using an In—Ga—Zn—O-based oxide target. As the In—Ga—Zn—O-based oxide target, for example, an oxide target having a composition ratio of $In_2O_3$:$Ga_2O_3$:ZnO=1:1:1 [molar ratio] can be used. Note that the material and composition of the sputtering target is not necessarily limited to the above. For example, an oxide target having a composition ratio of $In_2O_3$:$Ga_2O_3$:ZnO=1:1:2 [molar ratio] can be used. Alternatively, an oxide target having a composition ratio of $In_2O_3$:$Ga_2O_3$=1:1 [molar ratio] can be used. The filling rate of the oxide target is higher than or equal to 90% and lower than or equal to 100%, preferably higher than or equal to 95% and lower than or equal to 99.9%. This is because, with the use of the oxide target with a high filling rate, the formed oxide semiconductor film 530 can have high density.

The oxide semiconductor film 530 is preferably formed by a method in which hydrogen, water, or the like does not easily enter the oxide semiconductor film 530. The atmosphere for deposition may be a rare gas (typically argon) atmosphere, an oxygen atmosphere, a mixed atmosphere of a rare gas and oxygen, or the like. An atmosphere of a high-purity gas from which an impurity such as hydrogen, water, a hydroxyl group, or hydride is removed is preferable, in order to prevent hydrogen, water, a hydroxyl group, hydride, or the like from entering the oxide semiconductor film 530. For example, the oxide semiconductor film 530 can be formed by a DC sputtering method or the like. Note that the gate insulating layer 402 and the oxide semiconductor film 530 are preferably formed successively without exposure to the air.

For example, the oxide semiconductor film is formed in the following manner so that an impurity such as hydrogen, water, a hydroxyl group, or hydride can be prevented from entering the oxide semiconductor film.

The substrate 400 is placed in a deposition chamber kept under reduced pressure, and the substrate temperature is set to a temperature of higher than or equal to 100° C. and lower than or equal to 600° C., preferably higher than or equal to 200° C. and lower than or equal to 400° C. This is because when deposition is performed in the state where the substrate 400 is heated, the concentration of impurities in the oxide semiconductor film can be reduced. Moreover, damage due to sputtering can be reduced.

In order to remove moisture remaining in the deposition chamber, an entrapment vacuum pump such as a cryopump, an ion pump, or a titanium sublimation pump is preferably used as an evacuation unit. The evacuation unit may be a turbo pump provided with a cold trap. In the deposition chamber which is evacuated with the cryopump, a hydrogen molecule, a compound containing a hydrogen atom such as water ($H_2O$), (preferably, also a compound containing a carbon atom), and the like are removed. Accordingly, the concentration of impurities in the oxide semiconductor film formed in the deposition chamber can be reduced.

As an example of the deposition condition, the following conditions are employed: the distance between the substrate and the oxide target is 100 mm, the pressure is 0.6 Pa, the direct-current (DC) power is 0.5 kW, and the deposition atmosphere is an oxygen atmosphere (the proportion of oxygen flow: 100%). Note that a pulsed direct-current power source is preferable because powder substances (also referred to as particles or dust) generated in deposition can be reduced and the film thickness can be uniform.

Figure 1B:
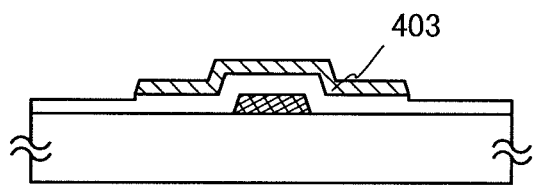

Then, the oxide semiconductor film 530 is processed. The oxide semiconductor film is processed by forming a mask having a desired shape over the oxide semiconductor film and then performing etching on the oxide semiconductor film The above mask can be formed by a method such as photolithography. Alternatively, a method such as an inkjet method may be used to form the mask. In this embodiment, the oxide semiconductor film is formed using an In—Ga—Zn—O film, and the gate insulating layer is formed using a $GaO_X$ film, that is, both include Ga. Therefore, the thickness of a region of the gate insulating layer 402 which is not covered with the mask is reduced at the time of processing the oxide semiconductor film, as illustrated in FIG. 1B.

Note that the etching of the oxide semiconductor film 530 may be dry etching or wet etching. It is needless to say that these may be combined.

After that, heat treatment (first heat treatment) is preferably performed on an oxide semiconductor layer 403 formed by the above processing. Hydrogen (including water and a hydroxyl group) in the oxide semiconductor layer 403 is removed by the first heat treatment and a structure of the oxide semiconductor layer 403 is improved, so that defect levels in the energy gap can be reduced. A cross-sectional view at this stage is illustrated in FIG. 1B. The first heat treatment is performed at higher than or equal to 250° C. and lower than or equal to 650° C., preferably higher than or equal to 450° C. and lower than or equal to 600° C. or lower than the strain point of the substrate.

Further, excessive hydrogen (including water and a hydroxyl group) in the gate insulating layer 402 can also be removed by the first heat treatment.

The first heat treatment can be performed in such a manner that, for example, an object to be processed is introduced into an electric furnace in which a resistance heating element or the like is used and heated at 450° C. under a nitrogen atmosphere for an hour. During the heat treatment, the oxide semiconductor layer 403 is not exposed to the air in order to prevent entry of water or hydrogen.

The heat treatment apparatus is not limited to the electric furnace and may be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The object to be processed is put in an inert gas atmosphere that has been heated, heated for several minutes, and taken out of the inert gas atmosphere. The GRTA process enables high-temperature heat treatment in a short time. Moreover, the GRTA process can be employed even when the temperature exceeds the upper temperature limit of the object to be processed. Note that the inert gas may be switched to a gas containing oxygen during the process. This is because defect levels in the energy gap due to oxygen vacancies can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

In any case, the i-type (intrinsic) or substantially i-type oxide semiconductor layer in which impurities are reduced by the first heat treatment is formed, which enables a transistor having extremely excellent characteristics to be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed at the timing, for example, after the oxide semiconductor film is processed to have an island shape. Such dehydration treatment or dehydrogenation treatment may be preformed once or plural times.

Note that the case of performing the first heat treatment after the oxide semiconductor film is processed into an island shape is described here; however, one embodiment of the disclosed invention is not construed as being limited thereto. The oxide semiconductor film may be processed after the first heat treatment is performed.

Figure 1C:
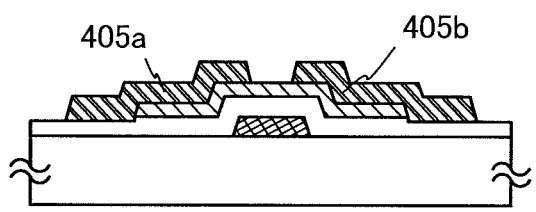

Then, a conductive film to be a source electrode and a drain electrode (including a wiring formed in the same layer as the source electrode and the drain electrode) is formed over the oxide semiconductor layer 403 by a sputtering method or the like, and the conductive film is processed so that a source electrode 405a and a drain electrode 405b are formed (see FIG. 1C).

An etching step may be performed using a resist mask formed using a multi-tone mask A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. In other words, simplification of the steps can be realized.

Note that, in the etching of the conductive film, a part of the oxide semiconductor layer 403 may be etched, whereby an oxide semiconductor layer having a groove (a depressed portion) is formed in some cases.

After that, by plasma treatment using a gas such as $N_2O$, $N_2$, or Ar, water or the like adsorbed to a surface of an exposed portion of the oxide semiconductor layer 403 may be removed. In the case where plasma treatment is performed, an insulating film 407 in contact with part of the oxide semiconductor layer 403 is preferably formed following the plasma treatment without exposure to the air.

The insulating film 407 is formed using a gallium oxide film obtained by the DC sputtering method of Embodiment 1. When the insulating film 407 is formed using a gallium oxide film and is in contact with the oxide semiconductor layer 403, charge trapping at an interface between the insulating film 407 and the oxide semiconductor layer 403 can be sufficiently suppressed.

Second heat treatment is preferably performed after the insulating film 407 is formed or after the source electrode 405a and the drain electrode 405b are formed. The second heat treatment is performed at higher than or equal to 250° C. and lower than or equal to 700° C., preferably higher than or equal to 450° C. and lower than or equal to 600° C. or lower than the strain point of the substrate.

The second heat treatment may be performed in an atmosphere of nitrogen, oxygen, ultra-dry air (air in which the water content is 20 ppm or less, preferably 1 ppm or less, more preferably 10 ppb or less), or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or a rare gas which is introduced into a heat treatment apparatus be set to be 6N or higher, preferably 7N or higher (that is, the impurity concentration is 1 ppm or lower, preferably 0.1 ppm or lower).

In the second heat treatment, heating is performed with the oxide semiconductor layer 403 and the insulating film 407 in contact with each other, and the gate insulating layer 402 and the oxide semiconductor layer 403 in contact with each other. Accordingly, oxygen which is one of main components of the oxide semiconductor and which may be reduced by the above dehydration (or dehydrogenation) treatment can be supplied to the oxide semiconductor layer 403 from both the insulating film 407 and the gate insulating layer 402. Thus, charge trapping centers in the oxide semiconductor layer 403 can be reduced.

Further, an impurity in the gate insulating layer 402 or the insulating film 407 is removed at the same time by the second heat treatment, whereby the gate insulating layer 402 or the insulating film 407 can be highly purified.

As described above, when at least one of the first heat treatment and the second heat treatment is employed, the oxide semiconductor layer 403 can be highly purified so that impurities that are not main components of the oxide semiconductor are contained therein as little as possible. The highly purified oxide semiconductor layer 403 includes extremely few carriers (close to zero) derived from a donor. The carrier concentration of the oxide semiconductor layer 403 is lower than $1\times10^{14}/cm^3$, preferably lower than $1\times10^{12}/cm^3$, further preferably lower than $1\times10^{11}/cm^3$.

Figure 1D:
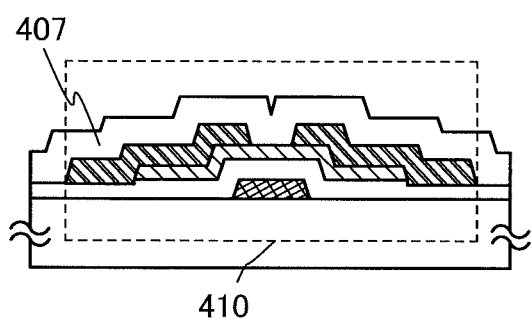
Figure 1E:
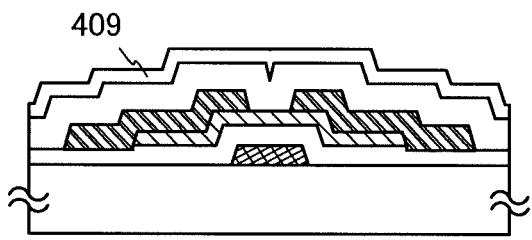

Through the above process, the transistor 410 illustrated in FIG. 1D is formed. Further, if necessary, a protective insulating layer 409 may be formed over the insulating film 407 (see FIG. 1E). Note that there is no particular limitation on the timing of the second heat treatment as long as it is after the formation of the oxide semiconductor film 530. For example, the second heat treatment may be performed after the formation of the protective insulating layer 409. Alternatively, the second heat treatment may be performed following the first heat treatment, or the first heat treatment may double as the second heat treatment, or the second heat treatment may double as the first heat treatment.

In the transistor 410 according to this embodiment, a gallium oxide film containing a component similar to that of the oxide semiconductor layer 403 (i.e., gallium) is provided on a top surface portion and a bottom surface portion of the oxide semiconductor layer 403. By providing a gallium oxide film which contains a component similar to that of the oxide semiconductor layer, on a top surface portion and a bottom surface portion of the oxide semiconductor layer, electric characteristics of a transistor do not change significantly even if gallium diffuses from a gallium oxide film to the oxide semiconductor layer. The above structure, in which a metal oxide film of a material which is compatible with an oxide semiconductor layer is provided in contact with the oxide semiconductor layer, is favorable for stabilizing electric characteristics of a transistor.

Since the gate insulating layer 402, the oxide semiconductor layer 403, and the insulating film 407 are all obtained by a DC sputtering method, the deposition rates thereof are high, which is industrially advantageous.

As described above, by using a DC sputtering method, a semiconductor device including an oxide semiconductor layer with stable electric characteristics can be provided. Therefore, a semiconductor device with high reliability can be provided.

Embodiment 3

In this embodiment, as an example of a semiconductor device, a memory medium (a memory element) will be described. In this embodiment, a transistor using an oxide semiconductor for a semiconductor layer and the gallium oxide film described in Embodiment 1 for an insulating layer, and a transistor using a material other than an oxide semiconductor for a semiconductor layer are formed over one substrate.

Figure 2A:
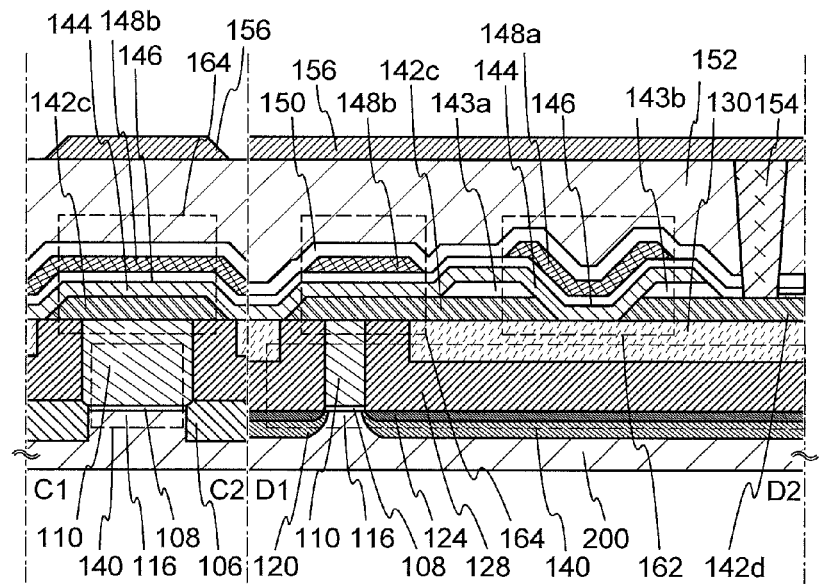
FIGS. 2A to 2C are a cross-sectional view, a top view, and an equivalent circuit diagram, respectively, illustrating one embodiment of the present invention.
Figure 2B:
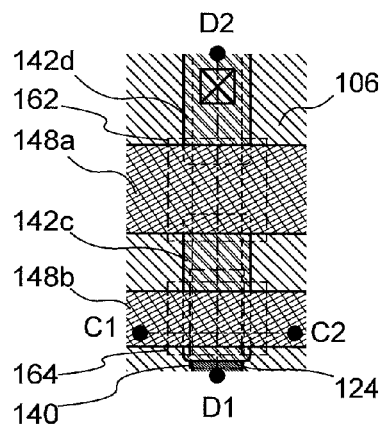
Figure 2C:
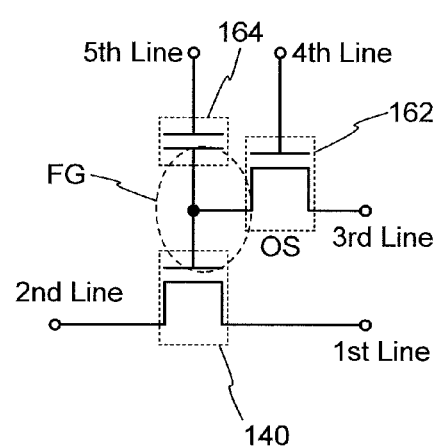

FIGS. 2A to 2C illustrate an example of a structure of a semiconductor device. FIG. 2A illustrates a cross section of the semiconductor device, and FIG. 2B illustrates a plan view of the semiconductor device. Here, FIG. 2A corresponds to a cross section along line C1-C2 and line D1-D2 in FIG. 2B. In addition, FIG. 2C illustrates an example of a diagram of a circuit using the semiconductor device as a memory element. The semiconductor device illustrated in FIGS. 2A and 2B includes a transistor 140 including a first semiconductor material in a lower portion, and a transistor 162 including a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material can operate at high speed easily. On the other hand, a transistor including an oxide semiconductor can hold charge for a long time owing to its characteristics.

The transistor 140 in FIGS. 2A to 2C includes a channel formation region 116 provided in a substrate 200 including a semiconductor material (such as silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108.

As the substrate 200 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

An element isolation insulating layer 106 is provided over the substrate 200 so as to surround the transistor 140. An insulating layer 128 and an insulating layer 130 are provided so as to cover the transistor 140. Note that it is preferable that the transistor 140 do not have a sidewall insulating layer as illustrated in FIGS. 2A to 2C to realize high integration. On the other hand, when importance is put on the characteristics of the transistor 140, sidewall insulating layers may be provided on side surfaces of the gate electrode 110, and the impurity regions 120 may include a region having a different impurity concentration.

The transistor 140 can be manufactured by a known technique. A gallium oxide film obtained by the DC sputtering method described in Embodiment 1 may be used as the gate insulating layer 108 of the transistor 140.

The transistor 140 can operate at high speed. Thus, when the transistor is used as a reading transistor, data can be read at high speed.

After the transistor 140 is formed, as treatment prior to the formation of the transistor 162 and a capacitor 164, the insulating layer 128 and the insulating layer 130 are subjected to CMP treatment so that the top surface of the gate electrode 110 is exposed. As the treatment for exposing the top surface of the gate electrode 110, etching treatment may be employed instead of CMP treatment. Note that it is preferable to planarize the surfaces of the insulating layer 128 and the insulating layer 130 as much as possible in order to improve the characteristics of the transistor 162.

Next, a conductive layer is formed over the gate electrode 110, the insulating layer 128, the insulating layer 130, and the like, and etched selectively so that a source or drain electrode 142c and a source or drain electrode 142d are formed.

The conductive layer can be formed by a PVD method such as a sputtering method, or a CVD method such as a plasma CVD method. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used.

The conductive layer may have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has the single-layer structure of a titanium film or a titanium nitride film, there is an advantage that the conductive layer is easily processed into the source or drain electrode 142c and the source or drain electrode 142d having tapered shapes.

The channel length (L) of the transistor 162 in the upper portion is determined by a distance between a lower edge portion of the source or drain electrode 142c and a lower edge portion of the source or drain electrode 142d. Note that for light exposure for forming a mask used in the case where a transistor with a channel length (L) of less than 25 nm is formed, it is preferable to use extreme ultraviolet rays whose wavelength is as short as several nanometers to several tens of nanometers.

Next, an insulating layer 143a is formed over the source or drain electrode 142c and an insulating layer 143b is formed over the source or drain electrode 142d. The insulating layer 143a and the insulating layer 143b can be formed in such a manner that an insulating layer that covers the source or drain electrode 142c and the source or drain electrode 142d is formed and then selectively etched. In addition, the insulating layer 143a and the insulating layer 143b are formed so as to overlap with part of the gate electrode formed later. When such an insulating layer is provided, capacitance between the gate electrode and the source or drain electrode can be reduced.

The insulating layer 143a and the insulating layer 143b can be formed using a material including an inorganic insulating material such as gallium oxide, silicon oxide, silicon oxynitride, silicon nitride, or aluminum oxide. In the case of using a gallium oxide film as the insulating layer 143a and the insulating layer 143b, the gallium oxide film may be formed in accordance with Embodiment 1.

Note that in view of reduction in the capacitance between the gate electrode and the source or drain electrode, the insulating layer 143a and the insulating layer 143b are preferably formed; however, a structure without the insulating layer 143a and the insulating layer 143b may be employed.

Next, after an oxide semiconductor layer is formed to cover the source or drain electrode 142c and the source or drain electrode 142d, the oxide semiconductor layer is selectively etched to form an oxide semiconductor layer 144.

After that, heat treatment (first heat treatment) is preferably performed on the oxide semiconductor layer 144. By the first heat treatment, excessive hydrogen (including water and a hydroxyl group) in the oxide semiconductor layer 144 can be removed, the structure of the oxide semiconductor layer 144 can be improved, and defect levels in the energy gap can be reduced. The temperature of the first heat treatment is, for example, higher than or equal to 300° C. and lower than 550° C., or higher than or equal to 400° C. and lower than or equal to 500° C.

The first heat treatment can be performed in such a manner that, for example, an object to be processed is introduced into an electric furnace in which a resistance heating element or the like is used and heated at 450° C. under a nitrogen atmosphere for an hour. During the heat treatment, the oxide semiconductor layer is not exposed to the air to prevent entry of water and hydrogen. The i-type (intrinsic) or substantially i-type oxide semiconductor layer in which impurities are reduced by the first heat treatment is formed, which enables the transistor 162 to have extremely excellent characteristics.

Next, a gate insulating layer 146 is formed on and in contact with the oxide semiconductor layer 144. For the gate insulating layer 146, the gallium oxide film and the deposition process thereof described in Embodiment 1 are used.

Next, over the gate insulating layer 146, a gate electrode 148a is formed in a region overlapping with the oxide semiconductor layer 144 and an electrode 148b is formed in a region overlapping with the source or drain electrode 142c.

After the gate insulating layer 146 is formed, second heat treatment is desirably performed in an inert gas atmosphere or an oxygen atmosphere. The second heat treatment is performed at a temperature higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor 162.

Note that the timing of the second heat treatment is not particularly limited to the above. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, at least one of the first heat treatment and the second heat treatment is applied, whereby the oxide semiconductor layer 144 can be highly purified so as to contain impurities that are not main components of the oxide semiconductor as little as possible.

The gate electrode 148a and the electrode 148b can be formed in such a manner that a conductive layer is formed over the gate insulating layer 146 and then etched selectively.

Then, an insulating layer 150 and an insulating layer 152 are formed over the gate insulating layer 146, the gate electrode 148a, and the electrode 148b. The insulating layer 150 and the insulating layer 152 can be formed by a sputtering method, a CVD method, or the like. The insulating layer 150 and the insulating layer 152 can be formed using a material including an inorganic insulating material such as gallium oxide, silicon oxide, silicon oxynitride, silicon nitride, hafnium oxide, or aluminum oxide. The insulating layer 150 and the insulating layer 152 can also be formed using the gallium oxide film and the deposition process thereof described in Embodiment 1.

Next, an opening that reaches the source or drain electrode 142d is formed in the gate insulating layer 146, the insulating layer 150, and the insulating layer 152. The opening is formed by selective etching with the use of a mask or the like.

After that, an electrode 154 is formed in the opening, and a wiring 156 in contact with the electrode 154 is formed over the insulating layer 152.

The electrode 154 can be formed in such a manner that, for example, a conductive layer is formed by a PVD method, a CVD method, or the like in a region including the opening and then part of the conductive layer is removed by etching treatment, CMP, or the like.

The wiring 156 is formed by forming a conductive layer by a PVD method such as a sputtering method, or a CVD method such as a plasma CVD method, and then by patterning the conductive layer. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used. The details are similar to those of the source or drain electrode 142c or the like.

Through the above process, the transistor 162 including the highly purified oxide semiconductor layer 144 and the capacitor 164 are completed. The capacitor 164 includes the source or drain electrode 142c, the oxide semiconductor layer 144, the gate insulating layer 146, and the electrode 148b.

Note that in the capacitor 164 in FIGS. 2A to 2C, the oxide semiconductor layer 144 and the gate insulating layer 146 are stacked, whereby insulation between the source or drain electrode 142c and the electrode 148b can be sufficiently secured. Needless to say, the oxide semiconductor layer 144 in the capacitor 164 may be omitted in order to secure sufficient capacitance. Alternatively, an insulating layer which is formed in a manner similar to that of the insulating layer 143a may be included in the capacitor 164. Further alternatively, the capacitor 164 may be omitted in the case where a capacitor is not needed.

FIG. 2C illustrates an example of a diagram of a circuit using the semiconductor device as a memory element. In FIG. 2C, one of a source electrode and a drain electrode of the transistor 162, one electrode of the capacitor 164, and a gate electrode of the transistor 140 are electrically connected to one another. A first wiring (a 1st line, also referred to as a source line) is electrically connected to a source electrode of the transistor 140. A second wiring (a 2nd line, also referred to as a bit line) is electrically connected to a drain electrode of the transistor 140. A third wiring (a 3rd line, also referred to as a first signal line) is electrically connected to the other of the source electrode and the drain electrode of the transistor 162. A fourth wiring (a 4th line, also referred to as a second signal line) is electrically connected to a gate electrode of the transistor 162. A fifth wiring (a 5th line, also referred to as a word line) and the other electrode of the capacitor 164 are electrically connected to each other.

The transistor 162 including an oxide semiconductor has extremely low off-state current; therefore, when the transistor 162 is in an off state, a potential of a node (hereinafter, a node FG) where the one of the source electrode and the drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

When data is stored in a memory cell (in writing of data), the potential of the fourth wiring is set to a potential at which the transistor 162 is turned on, whereby the transistor 162 is turned on. Thus, the potential of the third wiring is applied to the node FG and a predetermined amount of charge is accumulated in the node FG. Here, charge for applying either two different potential levels (hereinafter referred to as low-level charge and high-level charge) is given to the node FG. After that, the potential of the fourth wiring is set to a potential at which the transistor 162 is turned off, whereby the transistor 162 is turned off. This makes the node FG floating and the predetermined amount of charge is kept held in the node FG.

The predetermined amount of charge is thus accumulated and held in the node FG, whereby the memory cell can store data.

Since the off-state current of the transistor 162 is extremely small, the charge applied to the node FG is held for a long period. This can remove the need of refresh operation or drastically reduce the frequency of the refresh operation, which leads to a sufficient reduction in power consumption. Moreover, stored data can be stored for a long time even when power is not supplied.

When data stored in the memory cell is read out (in reading of data), while a predetermined potential (a fixed potential) is applied to the first wiring, an appropriate potential (a read-out potential) is applied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where the high-level charge is held in the node FG is lower than an apparent threshold value $V_{th\_L}$ of the transistor 140 in the case where the low-level charge is held in the node FG. Here, an apparent threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where the high-level charge is given to the node FG in writing, when the potential of the fifth wiring is set to $V_0(>V_{th\_H})$, the transistor 140 is turned on. In the case where the low-level charge is given to the node FG in writing, even when the potential of the fifth wiring is set to $V_0(<V_{th\_L})$, the transistor 140 remains in an off state. In such a manner, by controlling the potential of the fifth wiring and determining whether the transistor 140 is in an on state or off state (reading out the potential of the second wiring), data stored in the memory cell can be read out.

Further, in order to rewrite data stored in the memory cell, a new potential is applied to the node FG which is holding the predetermined amount of charge given in the above writing, so that the charge of the new data is held in the node FG. Specifically, the potential of the fourth wiring is set to a potential at which the transistor 162 is turned on, whereby the transistor 162 is turned on. Thus, the potential of the third wiring (a potential of new data) is applied to the node FG, and the predetermined amount of charge is accumulated in the node FG. After that, the potential of the fourth wiring is set to a potential at which the transistor 162 is turned off, whereby the transistor 162 is turned off. Thus, charge of the new data is held in the node FG. In other words, while the predetermined amount of charge given in the first writing is held in the node FG, the same operation (a second writing) as in the first writing is performed, whereby the data stored in the memory cell can be overwritten.

In the transistor 162 described in this embodiment, both the gate insulating layer and the oxide semiconductor layer are formed by a DC sputtering method, whereby generation of a defect such as an interface trap or an in-film trap can be suppressed. In addition, with the use of the highly purified and intrinsic oxide semiconductor layer 144, the off-state current of the transistor 162 can be sufficiently reduced. Further, with the use of such a transistor 162, a semiconductor device capable of holding stored data for an extremely long time can be obtained.

In the semiconductor device described in this embodiment, the transistor 140 and the transistor 162 are overlapping with each other; therefore, a semiconductor device in which the degree of integration is sufficiently improved can be realized.

The structures, methods, and the like described in this embodiment can be combined as appropriate with any of the structures, methods, and the like described in the other embodiments.

Embodiment 4

A semiconductor device having a display function (also referred to as a display device) can be manufactured using the transistor described as an example in Embodiment 2. Moreover, some or all of driver circuits which include the transistor can be formed over a substrate where a pixel portion is formed, whereby a system-on-panel can be obtained.

Figure 3A:
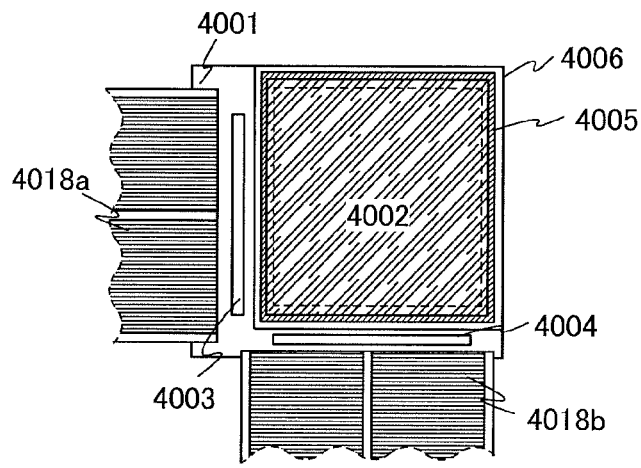
FIGS. 3A to 3C each illustrate one embodiment of a semiconductor device.

In FIG. 3A, a sealant 4005 is provided so as to surround a pixel portion 4002 provided over a first substrate 4001, and the pixel portion 4002 is sealed between the first substrate 4001 and a second substrate 4006. In FIG. 3A, a scan line driver circuit 4004 and a signal line driver circuit 4003 each are formed using a single crystal semiconductor film or a polycrystalline semiconductor film over a substrate prepared separately, and mounted in a region different from the region surrounded by the sealant 4005 over the first substrate 4001. Various signals and potentials are supplied to the signal line driver circuit 4003 and the scan line driver circuit 4004 each of which is separately formed, and the pixel portion 4002, from flexible printed circuits (FPCs) 4018*a* and 4018*b*.

Figure 3B:
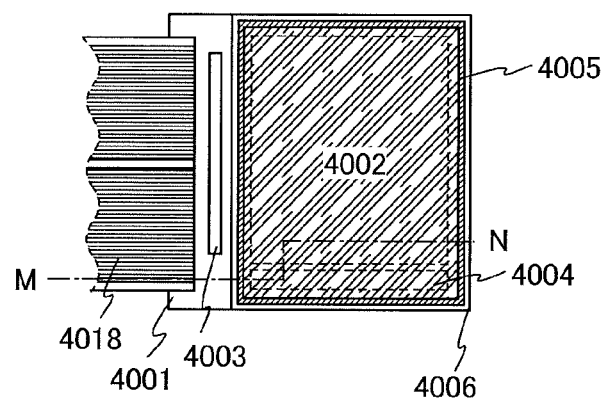
Figure 3C:
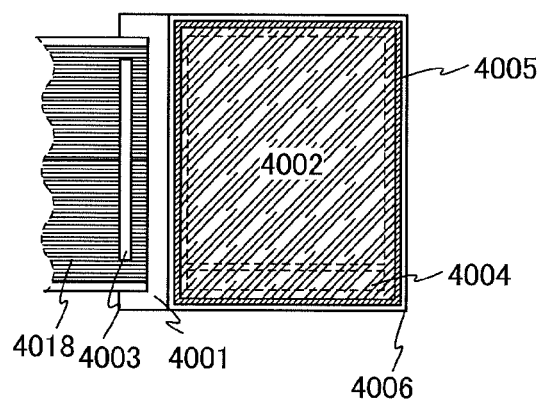

In FIGS. 3B and 3C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 3B and 3C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 3B and 3C, various signals and potentials are supplied to the signal line driver circuit 4003 which is separately formed, the scan line driver circuit 4004, and the pixel portion 4002 from an FPC 4018.

Although FIGS. 3B and 3C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 3A illustrates an example in which the signal line driver circuit 4003 and the scan line driver circuit 4004 are mounted by a COG method. FIG. 3B illustrates an example in which the signal line driver circuit 4003 is mounted by a COG method. FIG. 3C illustrates an example in which the signal line driver circuit 4003 is mounted by a TAB method.

In addition, the display device includes a panel in which the display element is sealed, and a module in which an IC and the like including a controller are mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors, to which the transistor whose example is described in Embodiment 2 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

Figure 4:
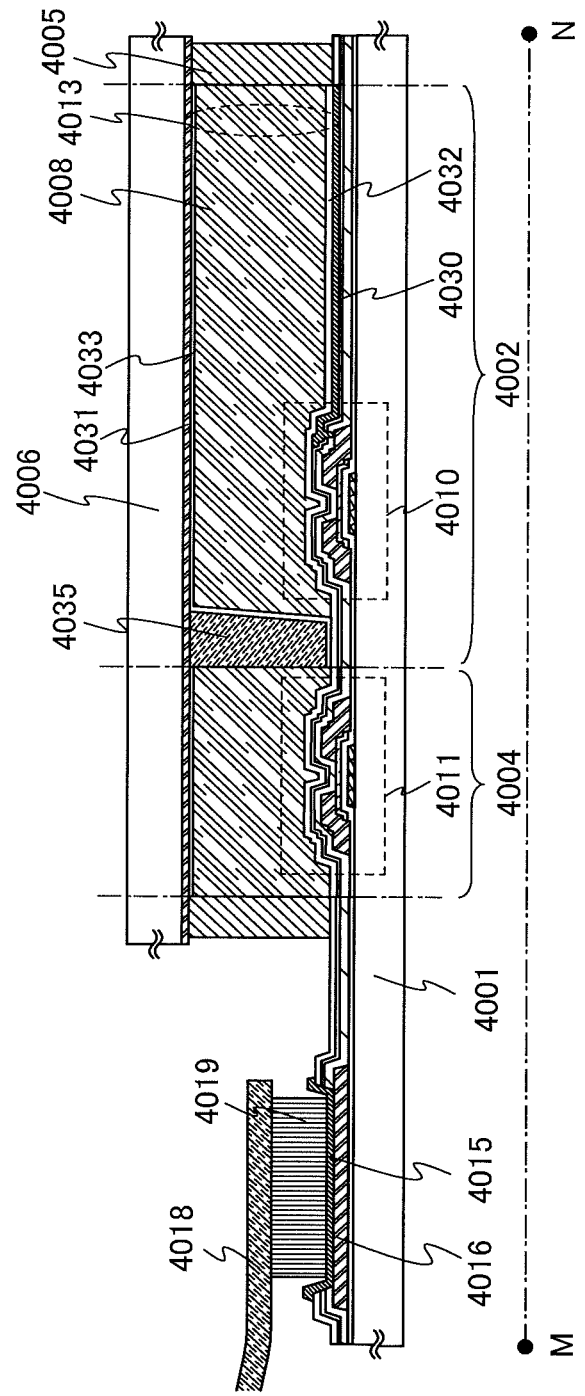
FIG. 4 illustrates one embodiment of a semiconductor device.
Figure 5:
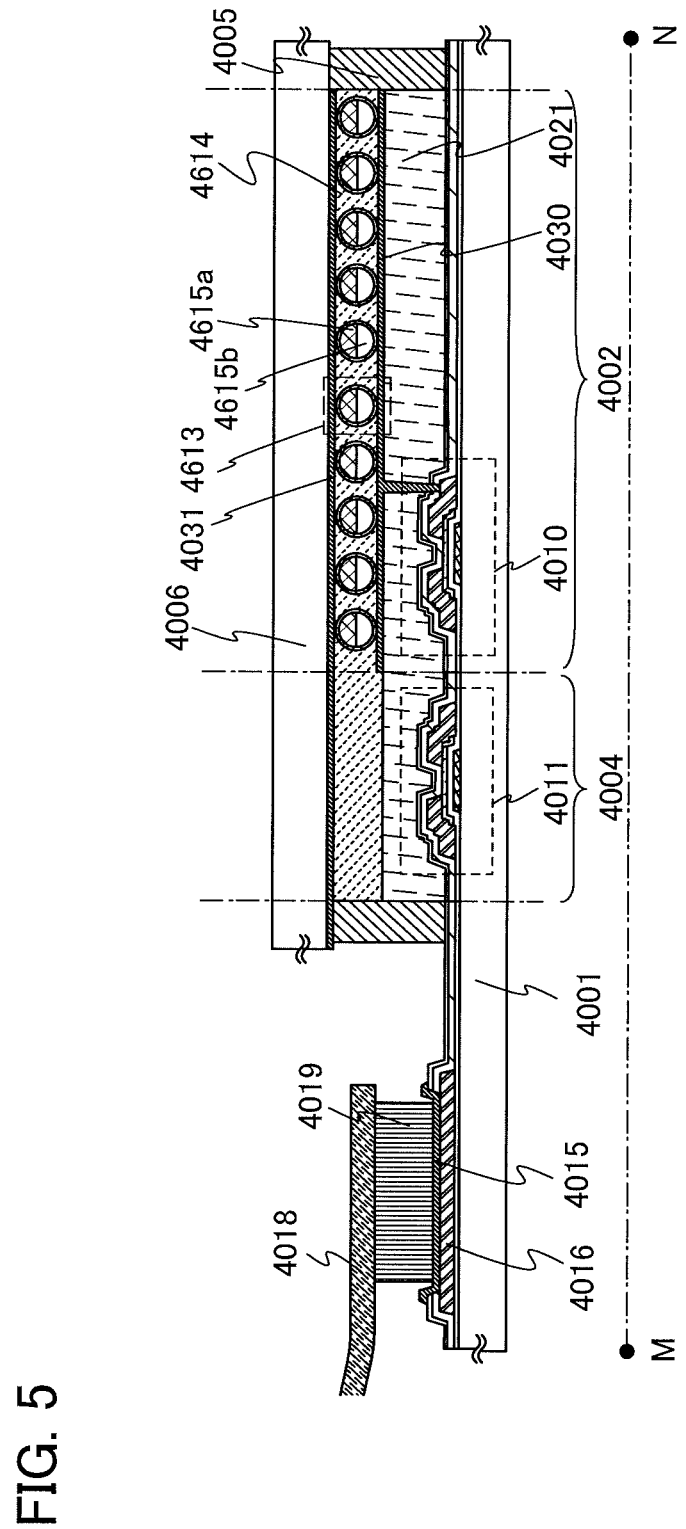
FIG. 5 illustrates one embodiment of a semiconductor device.

Embodiments of the semiconductor device will be described with reference to FIG. 4 and FIG. 5. FIG. 4 and FIG. 5 correspond to cross-sectional views along line M-N in FIG. 3B.

As illustrated in FIG. 4 and FIG. 5, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrodes of transistors 4010 and 4011.

The pixel portion 4002 and the scan line driver circuit 4004 which are provided over the first substrate 4001 include a plurality of transistors. FIG. 4 and FIG. 5 illustrate the transistor 4010 included in the pixel portion 4002 and the transistor 4011 included in the scan line driver circuit 4004, as an example.

In this embodiment, the transistor described in Embodiment 2 can be applied to the transistors 4010 and 4011. The transistors 4010 and 4011 are highly reliable and electrically stable. Accordingly, semiconductor devices with high reliability can be provided as the semiconductor devices of this embodiment illustrated in FIG. 4 and FIG. 5.

The transistor 4010 included in the pixel portion 4002 is electrically connected to a display element to form a display panel. A variety of display elements can be used as the display element as long as display can be performed.

An example of a liquid crystal display device using a liquid crystal element as a display element is described in FIG. 4. In FIG. 4, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

An insulating layer 4035 is a columnar spacer obtained by selective etching of an insulating film and is provided in order to control the thickness (a cell gap) of the liquid crystal layer 4008. Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal exhibiting a blue phase and a chiral material has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The capacitance of a storage capacitor formed in the liquid crystal display device is set considering the leakage current of the transistor provided in the pixel portion or the like so that charge can be held for a predetermined period.

The field-effect mobility of the transistor including a highly purified oxide semiconductor layer obtained in Embodiment 2 can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method of controlling alignment of liquid crystal molecules of a liquid crystal display panel, in which liquid crystal molecules are aligned vertically to a panel surface when no voltage is applied. Some examples are given as a vertical alignment mode. For example, an MVA (multi-domain vertical alignment) mode, a PVA (patterned vertical alignment) mode, an ASV mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. In particular, it is important to block light using a black matrix so that the oxide semiconductor layer of the transistor is not irradiated with light, in order to improve reliability of the display device. Circular polarization may be obtained using a polarizing substrate and a retardation substrate. In addition, a backlight, a side light, or the like may be used as a light source.

In addition, it is possible to employ a time-division display method (also called a field-sequential driving method) with the use of plural kinds of light-emitting diodes (LEDs) emitting different colors as a backlight. By employing a field-sequential driving method, color display can be performed without using a color filter.

As a display method in the pixel portion, a progressive method, an interlace method, or the like can be employed.

When the display device is provided with a color filter of three colors of R, G, and B (R, G, and B correspond to red, green, and blue, respectively) as color elements controlled in a pixel at the time of color display, color display can be performed. The color elements controlled in a pixel at the time of color display are not limited to the three colors: R, G, and B. For example, R, G, B, and W (W corresponds to white); R, G, B, and one or more of yellow, cyan, magenta, and the like; or the like can be used. Further, the sizes of display regions may be different between respective dots of color elements. The display device of this embodiment is not limited to a display device for color display, and this embodiment can also be applied to a display device for monochrome display.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device includes a plurality of microcapsules dispersed in a solvent or a solute, each microcapsule including first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move when an electric field is not applied. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above plurality of microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and an electric potential difference is generated between the first electrode layer and the second electrode layer to control the orientation of the spherical particles, whereby display is performed.

FIG. 5 illustrates an active matrix electronic paper as one embodiment of the semiconductor device. The electronic paper in FIG. 5 is an example of a display device using a twisting ball display system.

Between the first electrode layer 4030 connected to the transistor 4010 and the second electrode layer 4031 provided on the second substrate 4006, spherical particles 4613 each of which includes a black region 4615a and a white region 4615b are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 4 and FIG. 5, as the first substrate 4001 and the second substrate 4006, flexible substrates, for example, plastic substrates having a light-transmitting property or the like can be used, in addition to glass substrates. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive high molecule can be used. For example, polyaniline or a derivative thereof, polypyrrole or a derivative thereof, polythiophene or a derivative thereof, a copolymer of two or more kinds of aniline, pyrrole, and thiophene or a derivative thereof, and the like can be given.

Since the transistor is easily broken owing to static electricity or the like, a protective circuit for protecting the driver circuit is preferably provided. The protection circuit is preferably formed using a nonlinear element.

By using the transistor described as an example in Embodiment 2 as described above, the semiconductor device can have high reliability. Note that the transistor described in Embodiment 2 as an example can be applied to semiconductor devices having a variety of functions such as a power device mounted on a power supply circuit, a semiconductor integrated circuit such as an LSI, and a semiconductor device having an image sensor function for reading information of an object, in addition to the semiconductor device described above having a display function.

The structures, methods, and the like described in this embodiment can be combined as appropriate with any of the structures, methods, and the like described in the other embodiments.

Embodiment 5

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone set (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 6A:
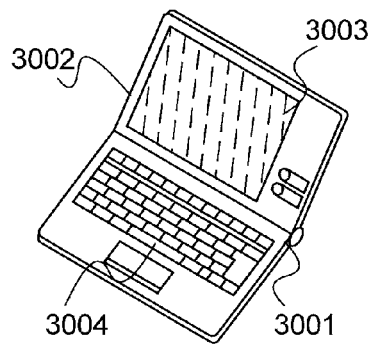
FIGS. 6A to 6F illustrate examples of electronic devices.

FIG. 6A illustrates a laptop personal computer, which includes a main body 3001, a housing 3002, a display portion 3003, a keyboard 3004, and the like. By using the semiconductor device described in Embodiment 2 or 4, the laptop personal computer can have high reliability.

Figure 6B:
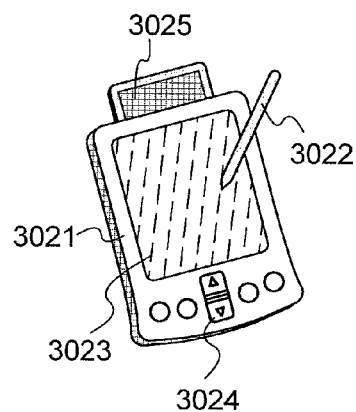

FIG. 6B illustrates a portable information terminal (PDA) including a display portion 3023, an external interface 3025, an operation button 3024, and the like in a main body 3021. A stylus 3022 is included as an accessory for operation. By using the semiconductor device described in Embodiment 2 or 4, the portable information terminal (PDA) can have high reliability.

Figure 6C:
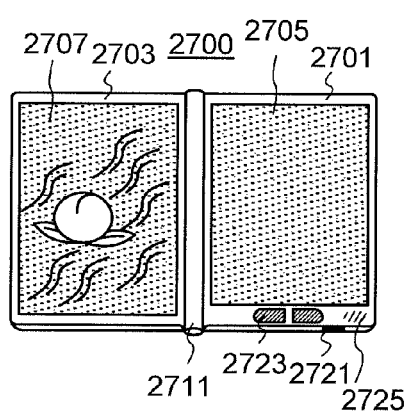

FIG. 6C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 6C) can display text and a display portion on the left (the display portion 2707 in FIG. 6C) can display graphics. By using the semiconductor device described in Embodiment 2 or 4, the electronic book reader can have high reliability.

FIG. 6C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 6D:
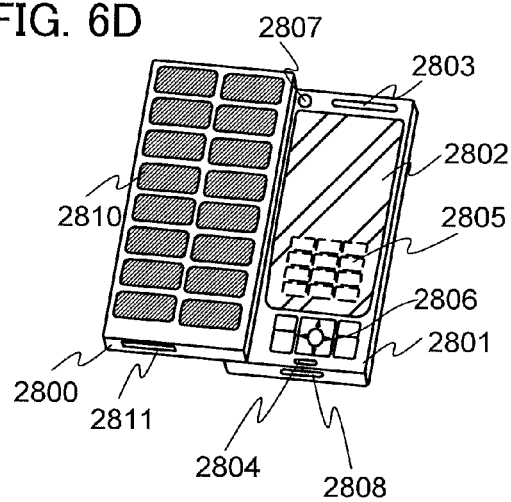

FIG. 6D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar cell 2810 for charging of the mobile phone, an external memory slot 2811, and the like. Further, an antenna is incorporated in the housing 2801. By using the semiconductor device described in Embodiment 2 or 4, the mobile phone can have high reliability.

The display panel 2802 is provided with a touch panel. A plurality of operation keys 2805 which is displayed as images is illustrated by dashed lines in FIG. 6D. Note that a boosting circuit by which voltage output from the solar cell 2810 is increased to be sufficiently high for each circuit is also included. The semiconductor device described in Embodiment 2 can be applied to the boosting circuit.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 developed as illustrated in FIG. 6D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

Figure 6E:
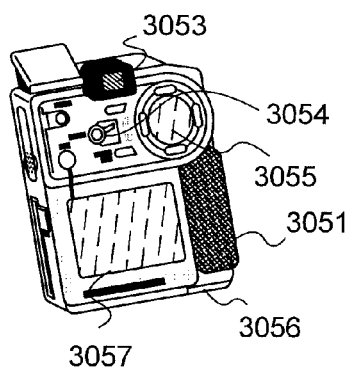

FIG. 6E illustrates a digital video camera which includes a main body 3051, a display portion A 3057, an eyepiece 3053, an operation switch 3054, a display portion B 3055, a battery 3056, and the like. By using the semiconductor device described in Embodiment 2 or 4, the digital video camera can have high reliability.

Figure 6F:
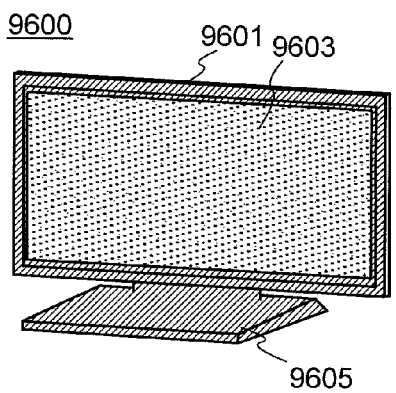

FIG. 6F illustrates an example of a television set. In a television set 9600, a display portion 9603 is incorporated in a housing 9601. The display portion 9603 can display images. Here, the housing 9601 is supported by a stand 9605. By using the semiconductor device described in Embodiment 2 or 4, the television set can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

This application is based on Japanese Patent Application serial no. 2010-095333 filed with Japan Patent Office on Apr. 16, 2010, the entire contents of which are hereby incorporated by reference.

EXPLANATION OF REFERENCE

106: element isolation insulating layer, 108: gate insulating layer, 110: gate electrode, 116: channel formation region, 120: impurity region, 124: metal compound region, 128: insulating layer, 130: insulating layer, 140: transistor, 142c: source or drain electrode, 142d: source or drain electrode, 143a: insulating layer, 143b: insulating layer, 144: oxide semiconductor layer, 146: gate insulating layer, 148a: gate electrode, 148b: electrode, 150: insulating layer, 152: insulating layer, 154: electrode, 156: wiring, 162: transistor, 164: capacitor, 200: substrate, 400: substrate, 401: gate electrode, 402: gate insulating layer, 403: oxide semiconductor layer, 405a: source electrode, 405b: drain electrode, 407: insulating film, 409: protective insulating layer, 410: transistor, 530: oxide semiconductor film, 2700: electronic book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion B, 3056: battery, 3057: display portion A, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: flexible printed circuit (FPC), 4018a: flexible printed circuit (FPC), 4018b: flexible printed circuit (FPC), 4019: anisotropic conductive film, 4021: insulating layer, 4030: electrode layer, 4031: electrode layer, 4032: insulating film, 4033: insulating film, 4035: insulating layer, 4613: spherical particle, 4614: filler, 4615a: black region, 4615b: white region, 9600: television set, 9601: housing, 9603: display portion, 9605: stand.

The invention claimed is:

1. A method for manufacturing a semiconductor device comprising the steps of:
    forming an oxide semiconductor layer;
    forming a gate insulating layer comprising gallium oxide on and in contact with the oxide semiconductor layer; and
    forming a gate electrode over the gate insulating layer,
    wherein the gate insulating layer is formed by a sputtering method,
    wherein the oxide semiconductor layer comprises a material represented by a chemical formula which is $InMO_3(ZnO)_m$ (m>0), and
    wherein M represents one or more metal elements selected from zinc, gallium, aluminum, manganese and cobalt.

2. The method for manufacturing a semiconductor device according to claim 1, wherein a pulsed DC power source is used as a power source for performing the sputtering method.

3. The method for manufacturing a semiconductor device according to claim 1, wherein an oxide target used for the sputtering method comprises silicon.

4. The method for manufacturing a semiconductor device according to claim 1, wherein an oxide target used for the sputtering method comprises aluminum.

5. The method for manufacturing a semiconductor device according to claim 1, wherein an oxide target used for the sputtering method comprises a material represented by a chemical formula which is $GaO_X$, wherein X is less than 1.5.

6. The method for manufacturing a semiconductor device according to claim 1, wherein the gate insulating layer comprises gallium oxide containing oxygen that exceeds a stoichiometric proportion.

7. The method for manufacturing a semiconductor device according to claim 1, wherein the oxide semiconductor layer comprising a metal oxide material containing oxygen that exceeds a stoichiometric proportion.

8. The method for manufacturing a semiconductor device according to claim 1, wherein the oxide semiconductor layer comprises indium, gallium and zinc.

9. A method for manufacturing a semiconductor device comprising the steps of:
    forming an oxide semiconductor layer;
    forming an insulating layer comprising gallium on and in contact with the oxide semiconductor layer; and
    forming an electrode over the insulating layer,
    wherein the insulating layer is formed by a sputtering method,
    wherein the oxide semiconductor layer comprises a material represented by a chemical formula which is $InMO_3(ZnO)_m$ (m>0), and
    wherein M represents one or more metal elements selected from zinc, gallium, aluminum, manganese and cobalt.

10. The method for manufacturing a semiconductor device according to claim 9, wherein a pulsed DC power source is used as a power source for performing the sputtering method.

11. The method for manufacturing a semiconductor device according to claim 9, wherein an oxide target used for the sputtering method comprises silicon.

12. The method for manufacturing a semiconductor device according to claim 9, wherein an oxide target used for the sputtering method comprises aluminum.

13. The method for manufacturing a semiconductor device according to claim 9, wherein an oxide target used for the sputtering method comprises a material represented by a chemical formula which is $GaO_X$, wherein X is less than 1.5.

14. The method for manufacturing a semiconductor device according to claim 9, wherein the oxide semiconductor layer comprising a metal oxide material containing oxygen that exceeds a stoichiometric proportion.

15. The method for manufacturing a semiconductor device according to claim 9, wherein the oxide semiconductor layer comprises indium, gallium and zinc.

16. A method for manufacturing a semiconductor device comprising the steps of:
    forming an oxide semiconductor layer;
    forming an insulating layer comprising gallium on and in contact with the oxide semiconductor layer; and
    forming an electrode over the insulating layer,
    wherein the insulating layer is formed by a sputtering method, and
    wherein an oxide target used for the sputtering method comprises a material represented by a chemical formula which is $GaO_X$, wherein X is less than 1.5.

17. The method for manufacturing a semiconductor device according to claim 16, wherein a pulsed DC power source is used as a power source for performing the sputtering method.

18. The method for manufacturing a semiconductor device according to claim 16, wherein the oxide target used for the sputtering method comprises silicon.

19. The method for manufacturing a semiconductor device according to claim 16, wherein the oxide target used for the sputtering method comprises aluminum.

20. The method for manufacturing a semiconductor device according to claim 16, wherein the oxide semiconductor layer comprising a metal oxide material containing oxygen that exceeds a stoichiometric proportion.

21. The method for manufacturing a semiconductor device according to claim 16, wherein the oxide semiconductor layer comprises indium, gallium and zinc.

22. The method for manufacturing a semiconductor device according to claim 16, wherein the oxide semiconductor layer comprises a material represented by a chemical formula which is $InMO_3(ZnO)_m$ (m>0),
    wherein M represents one or more metal elements selected from zinc, gallium, aluminum, manganese and cobalt.

* * * * *